(12) United States Patent
Farooq et al.

(10) Patent No.: US 11,239,167 B2
(45) Date of Patent: Feb. 1, 2022

(54) CU—CU BONDING FOR INTERCONNECTS ON BRIDGE CHIP ATTACHED TO CHIPS AND PACKAGING SUBSTRATE

(71) Applicant: International Business Machines Corporation, Armonk, NY (US)

(72) Inventors: Mukta Ghate Farooq, Hopewell Junction, NY (US); Ravi K. Bonam, Albany, NY (US); James J. Kelly, Schenectady, NY (US); Spyridon Skordas, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 16/703,252

(22) Filed: Dec. 4, 2019

(65) Prior Publication Data
US 2021/0175174 A1 Jun. 10, 2021

(51) Int. Cl.
*H01L 23/538* (2006.01)
*H01L 25/065* (2006.01)
(Continued)

(52) U.S. Cl.
CPC .......... *H01L 23/5381* (2013.01); *H01L 24/16* (2013.01); *H01L 25/0655* (2013.01);
(Continued)

(58) Field of Classification Search
CPC ................. H01L 25/0655; H01L 25/50; H01L 2224/16227; H01L 2224/13147;
(Continued)

(56) References Cited

U.S. PATENT DOCUMENTS

| 3,832,176 A | 8/1974 | Verstraete et al. |
| 7,462,942 B2 | 12/2008 | Tan et al. |

(Continued)

FOREIGN PATENT DOCUMENTS

CN 104465613 A 3/2015

OTHER PUBLICATIONS

Arai et al., "Cu—Cu direct bonding technology using ultrasonic vibration for flip-chip interconnection," 2015 International Conference on Electronics Packaging and iMAPS All Asia Conference (ICEP-IAAC) pp. 468-472 (Apr. 2015).

(Continued)

*Primary Examiner* — Jasmine J Clark
(74) *Attorney, Agent, or Firm* — Abdy Raissinia; Michael J. Chang, LLC

(57) ABSTRACT

Copper (Cu)-to-Cu bonding techniques for high bandwidth interconnects on a bridge chip attached to chips which are further attached to a packaging substrate are provided. In one aspect, a method of forming an interconnect structure is provided. The method includes: bonding individual chips to at least one bridge chip via Cu-to-Cu bonding to form a multi-chip structure; and bonding the multi-chip structure to a packaging substrate via solder bonding, after the Cu-to-Cu bonding has been performed, to form the interconnect structure including the individual chips bonded to the at least one bridge chip and to the packaging substrate. A structure formed by the method is also provided.

20 Claims, 11 Drawing Sheets

(51) Int. Cl.
   *H01L 23/00* (2006.01)
   *H01L 25/00* (2006.01)

(52) U.S. Cl.
   CPC .... *H01L 25/50* (2013.01); *H01L 2224/13147* (2013.01); *H01L 2224/16227* (2013.01)

(58) Field of Classification Search
   CPC ............... H01L 224/16; H01L 25/0652; H01L 23/5381; H01L 24/18; H01L 21/6835; H01L 25/0657; H01L 2225/06513; H01L 2225/06562
   See application file for complete search history.

(56) References Cited

U.S. PATENT DOCUMENTS

| | | |
|---|---|---|
| 7,608,174 B1 | 10/2009 | Hachman et al. |
| 8,227,904 B2 | 7/2012 | Braunisch et al. |
| 8,581,401 B2 | 11/2013 | Lu et al. |
| 8,742,578 B2 | 6/2014 | Arvin et al. |
| 8,866,308 B2 | 10/2014 | Roy et al. |
| 9,343,419 B2 | 5/2016 | Yu et al. |
| 9,640,521 B2 | 5/2017 | Chang et al. |
| 9,666,559 B2 | 5/2017 | Wang et al. |
| 9,693,455 B1 | 6/2017 | Park et al. |
| 9,799,618 B1 | 10/2017 | Arvin et al. |
| 10,014,218 B1 | 7/2018 | Shih et al. |
| 10,163,844 B2 | 12/2018 | Lin et al. |
| 2005/0133933 A1 | 6/2005 | Shen et al. |
| 2008/0003805 A1 | 1/2008 | Pang et al. |
| 2009/0108443 A1 | 4/2009 | Jiang |
| 2009/0267238 A1 | 10/2009 | Joseph et al. |
| 2014/0061897 A1 | 3/2014 | Lin et al. |
| 2014/0321803 A1 | 10/2014 | Thacker et al. |
| 2014/0321804 A1 | 10/2014 | Thacker et al. |
| 2014/0361420 A1 | 12/2014 | Yilmaz et al. |
| 2015/0171015 A1 | 6/2015 | Mahajan et al. |
| 2015/0364422 A1 | 12/2015 | Zhai et al. |
| 2018/0286812 A1 | 10/2018 | Jain et al. |
| 2020/0006241 A1* | 1/2020 | Wu .................. H01L 24/73 |

OTHER PUBLICATIONS

Liu et al., "Development of high yield, reliable fine pitch flip chip interconnects with copper pillar bumps and thin coreless substrate," 2015 IEEE 65th Electronic Components and Technology Conference (ECTC), pp. 1713-1717 (May 2015).

English Translation of CN104465613A by Wang Zihao et al., Mar. 25, 2015.

List of IBM Patents or Applications Treated as Related (2 pages).

* cited by examiner (Continue to FIG. 10)

CU—CU BONDING FOR INTERCONNECTS ON BRIDGE CHIP ATTACHED TO CHIPS AND PACKAGING SUBSTRATE

FIELD OF THE INVENTION

The present invention relates to interconnect technology, and more particularly, to copper (Cu)-to-Cu bonding for high bandwidth interconnects on a bridge chip attached to (e.g., logic and/or memory chips) which are further attached to a packaging substrate.

BACKGROUND OF THE INVENTION

In heterogeneous integration for artificial intelligence workloads, it is important for inter-chip communication to occur at high bandwidths. In some configurations, this inter-chip communication has to occur while chips are connected to a packaging substrate.

In order to enable chips to communicate with each other with relatively low power losses while attached to a packaging substrate, a connection or bridge chip can be used. The bridge chip can then be used for connection to the main logic or memory chips to enable high speed connections. Such a scheme requires copper (Cu)-to-Cu or similar interface rather than a conventional solder joint.

However, most multiple-chip combinations use solder on some of the chips for joining to the packaging substrate. This solder typically has a low melting point, e.g., of from about 221° C. to about 230° C. Cu-to-Cu bonding is often carried out at temperatures greater than or equal to about 300° C. Thus, existing solder bonds would be rendered molten during the Cu-to-Cu bonding process, causing solder reflow and movement across the chip surface. Solder reflow is a is of particular concern when the solder connections are not encased in a protective encapsulant, i.e., an underfill.

Thus, improved techniques for forming high bandwidth interconnects of chips connected to a packaging substrate with a bridge chip and Cu-to-Cu bonding would be desirable.

SUMMARY OF THE INVENTION

The present invention provides copper (Cu)-to-Cu bonding techniques for high bandwidth interconnects on a bridge chip attached to chips which are further attached to a packaging substrate. In one aspect of the invention, a method of forming an interconnect structure is provided. The method includes: bonding individual chips to at least one bridge chip via copper (Cu)-to-Cu bonding to form a multi-chip structure; and bonding the multi-chip structure to a packaging substrate via solder bonding, after the Cu-to-Cu bonding has been performed, to form the interconnect structure including the individual chips bonded to the at least one bridge chip and to the packaging substrate.

In another aspect of the invention, a structure is provided. The structure includes: at least one bridge chip having Cu pads on a front side of the at least one bridge chip; individual chips bonded to the at least one bridge chip via Cu-to-Cu bonds to form a multi-chip structure, wherein the individual chips include at least a first Cu pillar having a height Hpillar1 and a second Cu pillar having a height Hpillar2 on a front side of the individual chips, wherein Hpillar1>Hpillar2, and wherein the Cu-to-Cu bonds are present between the Cu pads of the at least one bridge chip and the second Cu pillar of the individual chips such that the first Cu pillar of the individual chips hangs off to a side of the at least one bridge chip; and a packaging substrate bonded to the multi-chip structure via solder bonds between the first Cu pillar of the individual chips and the packaging substrate.

A more complete understanding of the present invention, as well as further features and advantages of the present invention, will be obtained by reference to the following detailed description and drawings.

DETAILED DESCRIPTION OF PREFERRED EMBODIMENTS

Figure 1:
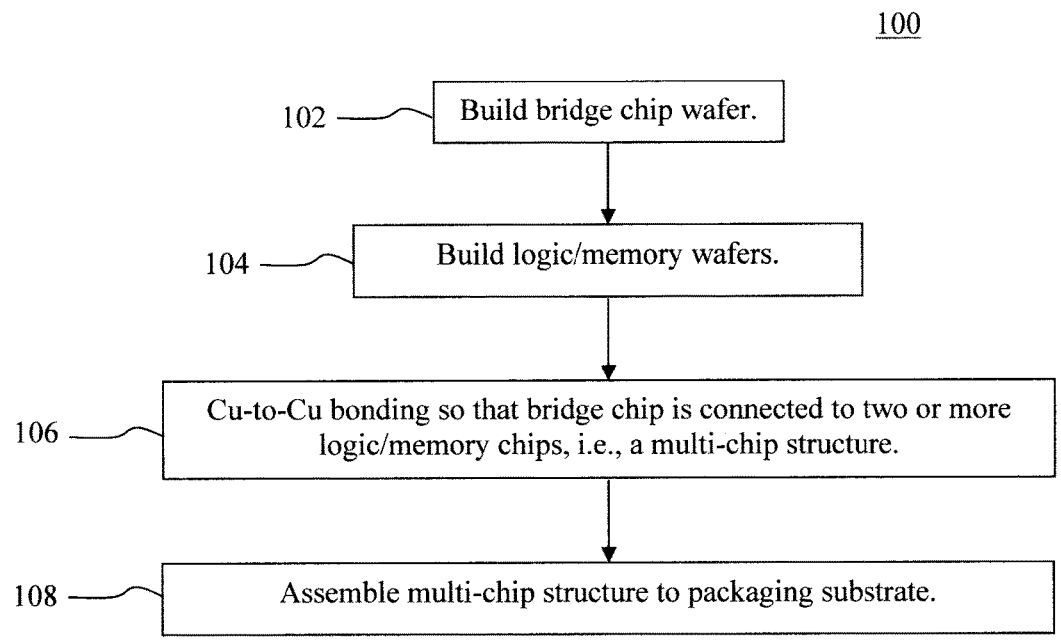
FIG. 1 is a diagram illustrating an exemplary methodology for forming high bandwidth interconnects according to an embodiment of the present invention.

As highlighted above, a bridge chip can be used to enable high bandwidth inter-chip communications. However, the thermal budget for copper (Cu)-to-Cu or similar interfaces to the bridge chip is incompatible with the solder connections typically employed to the packaging substrate. For instance, the solder used on chips for joining to the packaging substrate typically has a melting point of from about 221° C. to about 230° C. On the other hand, Cu-to-Cu bonding is often carried out at temperatures greater than or equal to about 300° C. Thus, performing Cu-to-Cu bonding in the presence of existing solder bonds will allow the solder to flow and move across the surface, creating create electrical failures due to shorting and/or opens. In the context of the present techniques, the term "die" refers generally to a piece of semiconductor containing an integrated circuit. The terms "die" and "chip" may be used herein interchangeably.

Advantageously, provided herein are techniques for forming high bandwidth interconnects on a bridge chip attached to a die which are further attached to a packaging substrate, whereby the Cu—Cu bonding is achieved first in the absence of solder. The solder is deposited later, to enable good joints to the packaging substrate. Thus, any concerns regarding the incompatibility of existing solder connections during Cu-to-Cu bonding are avoided altogether.

As will be described in detail below, the bridge chip is attached with a Cu-to-Cu bond. Advantageously, Cu-to-Cu bonding to the bridge chip enables a finer interconnect size and pitch as compared to conventional solder joining. For instance, according to an exemplary embodiment, the (Cu-to-Cu bond) interconnects to the bridge chip have a pitch of from about 5 micrometers (μm) to about 10 μm, and ranges therebetween. The term 'pitch,' as used herein, refers to the distance from a given point on one interconnect to the same point on the adjacent interconnect.

Since there is no solder on any of the chips during the Cu-to-Cu bonding step, processing temperatures that exceed the solder melting point can be employed. For instance, according to an exemplary embodiment, the Cu-to-Cu bonding process is carried out at temperatures greater than or equal to about 300° C. and ranges therebetween, e.g., at temperatures of from about 300° C. to about 400° C. and ranges therebetween.

Further, the present process can easily and effectively accommodate chips of different and varying heights. This feature is important since the chips in a heterogenous integration scheme can be obtained from different sources and oftentimes have different dimensions. For instance, according to an exemplary embodiment, the present scheme involves the integration of logic and memory chips (and/or other types of chips) arriving from different sources through joining to one or more bridge chips. To use a simple, non-limiting example, typically graphics processing unit (GPU)/accelerator chips are of different thicknesses than high bandwidth memory (HBM) stacked chips. Obtaining chips from different sources is, however, not an issue since the height of the individual chips (and variations in the heights of the individual chips) does not impact the process.

Following the Cu-to-Cu bonding procedure, solder bonding is then employed for assembly of the packaging substrate. Advantageously, use of solder bonding for the packaging substrate assembly provides a level of 'give' to compensate for warpage, non-flatness, and/or non-planarity issues in the package. The use of solder is most often a requirement to enable good joints between Si die and organic packaging substrates.

An overview of the present techniques is now provided by way of reference to exemplary methodology 100 of FIG. 1 for forming high bandwidth interconnects. Methodology 100 of FIG. 1 will be described in conjunction with the description of FIG. 2 which illustrates, according to an exemplary embodiment, a structure 200 with Cu-to-Cu Bonds for high bandwidth interconnects on a Bridge Chip attached to Logic and/or Memory chips to form a multi-chip structure which is further attached to a Packaging Substrate by Solder Bonds via Cu Pillars.

In step 102 of methodology 100, a bridge chip wafer is built. The bridge chip wafer will be diced into individual bridge chips (see, e.g., the Bridge Chip in structure 200 of FIG. 2) which, as highlighted above, will be used to integrate multiple chips (see, e.g., Logic/Memory Chip 1, Logic/Memory Chip 2, etc. in structure 200 of FIG. 2) via Cu-to-Cu bonding (see, e.g., Cu-to-Cu Bond in structure 200 of FIG. 2).

The bridge chip wafer is built on a semiconductor substrate. According to an exemplary embodiment, the semiconductor substrate is a bulk semiconductor wafer, such as a bulk silicon (Si), bulk germanium (Ge), bulk silicon germanium (SiGe) and/or bulk III-V semiconductor wafer. Alternatively, the semiconductor wafer can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Figure 2:
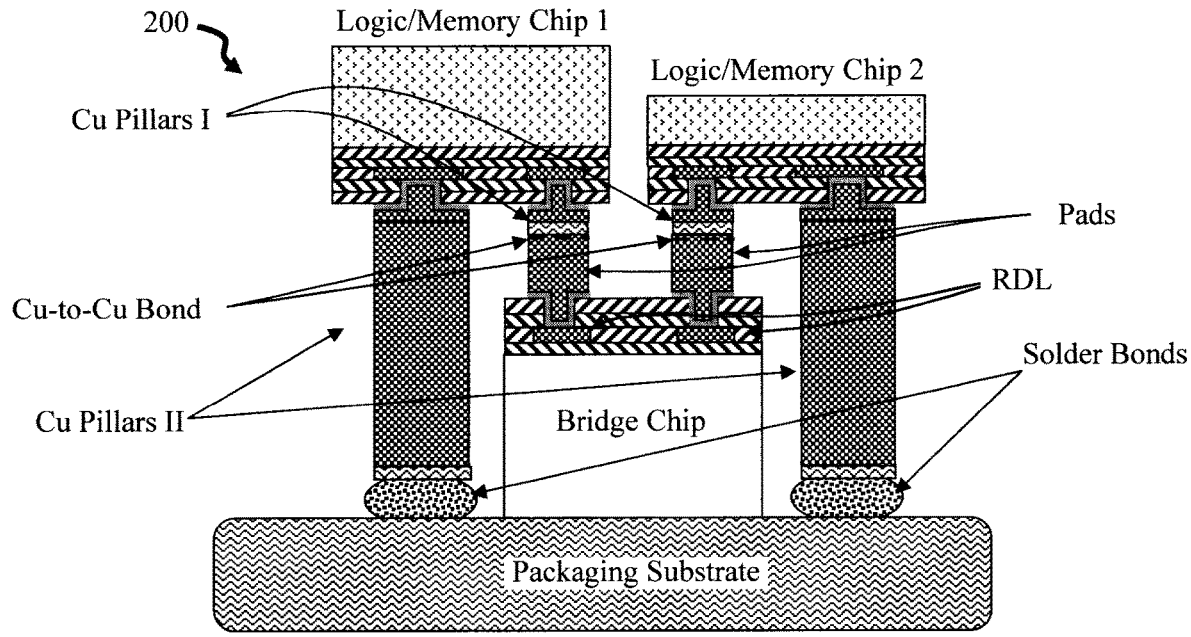
FIG. 2 is a cross-sectional diagram illustrating a structure having copper (Cu)-to-Cu bonds for high bandwidth interconnects on a bridge chip attached to logic and/or memory chips to form a multi-chip structure which is further attached to a packaging substrate by solder bonds via cu pillars according to an embodiment of the present invention.

A redistribution layer (see, e.g., RDL in structure 200 of FIG. 2) is built on the semiconductor wafer that terminates in an under bump metallization (UBM) pad(s) (see, e.g., Pads in structure 200 of FIG. 2). In general, an RDL layer is a metal (or other conductive) wiring layer that serves to 'redistribute' electrical communications to different areas of a chip. For instance, when a chip contains an integrated circuit design with input and output pads, an RDL can be employed on the chip to provide access to the input and output pads at other locations on the chip. As will be described in detail below, the UBM Pads are one component of the Cu-to-Cu bonds that will be formed between the Bridge Chip and the Logic/Memory Chip 1, Logic/Memory Chip 2, etc.

Once completed, the bridge chip wafer is diced into individual Bridge Chips. One of the Bridge Chips is shown illustrated in structure 200 of FIG. 2. It is notable that, while structure 200 of FIG. 2 illustrates a design having a single Bridge Chip, this is done merely for clarity and ease of depiction. Namely, the present techniques can be implemented in the same manner described to integrate Logic/Memory Chips via multiple Bridge Chips.

In step 104, logic/memory wafers are built. The logic/memory wafers are built on semiconductor substrates, for example, bulk Si, bulk Ge, bulk SiGe and/or bulk III-V semiconductor wafers, or Si, Ge, SiGe, and/or a III-V semiconductor SOI wafers. As highlighted above, the chips in a heterogenous integration scheme such as this oftentimes have different dimensions. See, e.g., in structure 200 of FIG. 2 where Logic/Memory Chip 1 and Logic/Memory Chip 2 have different heights. However, having chips of varying dimensions does not impact the present process.

The metallization of the logic/memory wafers terminates in UBM pillars of varying desired heights (see, e.g., Cu Pillars I and II in structure 200 of FIG. 2). As will be described in detail below, the Cu Pillars I are the other components of the Cu-to-Cu bond that will be formed between the Bridge Chip and the Logic/Memory Chip 1, Logic/Memory Chip 2, etc. The Solder Bonds between the Cu Pillars II and the packaging substrate will serve to integrate the Logic/Memory Chips/Bridge Chip (multi-chip) structure with the Packaging Substrate. However, the solder bonds are not formed until after the Cu-to-Cu bonding has been performed. The Cu Pillars II are also referred to herein as 'hanging' pillars since they hang over the packaging substrate on either side of the Bridge Chip.

Forming the UBM Cu Pillars I and II having varying heights on the logic/memory wafers can be performed in a number of different ways. With conventional metallization techniques, the UBM Cu Pillars I and II of varying heights can be formed using multiple, consecutive electroplating steps, each of which involves a photoresist mask. Forming features such as Cu pillars of varying sizes in this manner is well known to those of ordinary skill in the art and thus is not described in further detail herein. The use of multiple electroplating steps, with multiple photoresist masks is, however, expensive and inefficient.

Thus, for increased efficiency and lowered production costs, the techniques described in U.S. patent application Ser. No. 16/703,173 by Farooq et al., entitled "Simultaneous Plating of Varying Size Features on Semiconductor Substrate," (hereinafter "U.S. patent application Ser. No. 16/703,173"), the contents of which are incorporated by reference as if fully set forth herein. As described in U.S. patent application Ser. No. 16/703,173, a shield is placed over a wafer during electroplating to alter the local deposition rates for those portions of the wafer covered by the shield as compared to other portions of the wafer the shield leaves uncovered. Thus, metallurgical features (such as Cu pillars) of varying sizes can be formed simultaneously on the wafer. Advantageously, only a single photoresist mask is needed to electroplate these metallurgical features of varying sizes. Further, the same techniques can be employed to plate multiple metals into the features, as well as to electroplate solder (also of varying size) onto the features.

Once completed, the logic/memory wafers are diced into individual Logic/Memory Chips. See, e.g., individual Logic/Memory Chip 1 and Logic/Memory Chip 2 in structure 200 of FIG. 2. It is notable that, while structure 200 of FIG. 2 illustrates a design having two Logic/Memory Chips, this is done merely for clarity and ease of depiction. Namely, the present techniques can be implemented in the same manner described to integrate any number of Logic/Memory Chips.

In step 106, Cu-to-Cu bonding is used to join the Bridge Chip to multiple Logic/Memory Chips forming a multi-chip structure. For instance, in structure 200 of FIG. 2, the Bridge Chip is bonded via Cu-to-Cu bonding to Logic/Memory Chip 1 and Logic/Memory Chip 2. Specifically, the Cu-to-Cu bonding occurs between the Cu Pads of the Bridge Chip and the Cu Pillars I of Logic/Memory Chip 1 and Logic/Memory Chip 2.

In one exemplary embodiment, the Cu-to-Cu bonding is carried out using a thermo-compressive bonding process. Thermo-compressive bonding involves bringing metal structures (in this case the Cu Pads of the Bridge Chip and the Cu Pillars I of Logic/Memory Chip 1 and Logic/Memory Chip 2) into physical contact with one another under conditions sufficient to bond the metal structures together. According to an exemplary embodiment, the conditions include a temperature of from about 300° C. to about 400° C. and ranges therebetween, and a pressure of greater than or equal to about 10 kiloNewton per square meter ($kN/m^2$), e.g., from about 10 $kN/m^2$ to about 1 MegaNewton per square meter ($MN/m^2$) and ranges therebetween. At these elevated temperatures, the integrity of any solder bonds (if present) would be compromised, and there would be solder reflow and movement across the interfaces where solder is present. However, with the present process flow no solder is yet present on any of the chips.

In step 108, the multi-chip structure (e.g., the Bridge Chip with Cu-to-Cu bonding to Logic/Memory Chip 1 and Logic/Memory Chip 2) is assembled to the Packaging Substrate. As highlighted above, solder bonding is used for assembly to the packaging substrate which advantageously provides a level of compensate for warpage, non-flatness, and/or non-planarity issues in the package.

Solder deposits can come pre-formed on the Packaging Substrate. According to an exemplary embodiment, the solder includes tin (Sn), silver (Ag), Cu, and/or alloys thereof such as tin-silver (SnAg) solder and/or tin-silver-copper (SnAgCu) solder. An appropriate amount of solder is placed on the Packaging Substrate to enable complete joining of the multi-chip structure to the Packaging Substrate.

Figure 3:
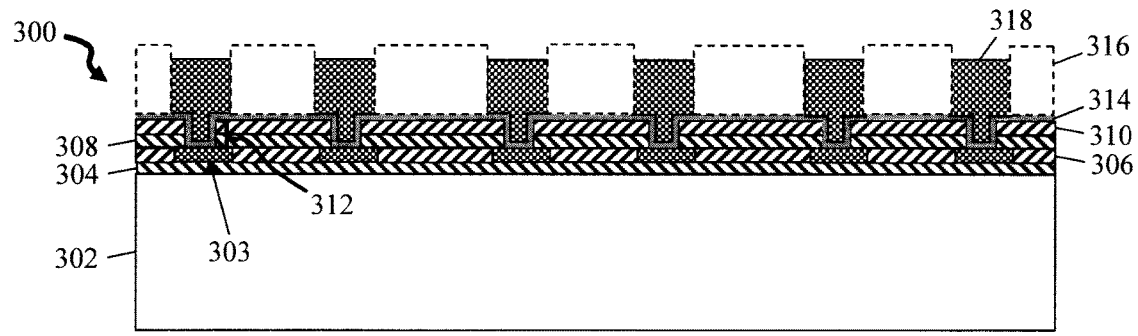
FIG. 3 is a cross-sectional diagram illustrating a bridge chip wafer according to an embodiment of the present invention.

Given the above overview, an exemplary implementation of the present techniques is now described by way of reference to FIGS. 3-11. The process begins with the building of a bridge chip wafer 300. See FIG. 3. As shown in FIG. 3, bridge chip wafer 300 is built on a semiconductor substrate 302, for example, a bulk Si, bulk Ge, bulk SiGe and/or bulk III-V semiconductor wafer, or a Si, Ge, SiGe, and/or a III-V semiconductor SOI wafer (see above).

Standard metallization techniques are then employed to form metal lines 303 on semiconductor substrate 302. Metal lines 303 can be part of an RDL layer on semiconductor substrate 302. As described above, an RDL is a metal (or other conductive) wiring layer that serves to 'redistribute' electrical communications to different areas of a chip (in this case the bridge chip). According to an exemplary embodiment, a first dielectric layer 304 is deposited onto semiconductor substrate 302. Suitable materials for first dielectric layer 304 include, but are not limited to, oxide materials such as silicon dioxide ($SiO_2$) and/or silicon oxycarbide (SiOC) and/or nitride materials such as silicon nitride (SiN) and/or silicon oxycarbonitride (SiOCN). A process such as chemical vapor deposition (CVD), atomic layer deposition (ALD) or physical vapor deposition (PVD) can be used to deposit first dielectric layer 304 onto semiconductor substrate 302. According to an exemplary embodiment, first dielectric layer 304 has a thickness of from about 500 nanometers (nm) to about 2 micrometers (μm), and ranges therebetween.

Metal lines 303 are then formed on first dielectric layer 304. According to an exemplary embodiment, metal lines 303 are formed by first depositing a contact metal onto first dielectric layer 304. Standard lithography and etching techniques are then used to pattern the contact metal into the individual metal lines 303. With standard lithography and etching process, a lithographic stack (not shown), e.g., photoresist/organic planarizing layer (OPL)/anti-reflective coating (ARC), is typically used to pattern a hardmask (not shown). The pattern from the hardmask is then transferred to the underlying substrate (in this case the contact metal). The hardmask is then removed. Suitable etching processes include, but are not limited to, a directional (anisotropic) etching process such as reactive ion etching (RIE). Alternatively, metal lines 303 can be formed using a standard damascene process well known to those skilled in the art. Suitable contact metals include, but are not limited to, copper (Cu), cobalt (Co), ruthenium (Ru) and/or tungsten (W). According to an exemplary embodiment, metal lines 303 have a thickness of from about 5 nm to about 0.5 μm and ranges therebetween.

A second dielectric layer 306 is then deposited onto the first dielectric layer 304 surrounding the metal lines 303, a third dielectric layer 308 is deposited onto the second dielectric layer 306 and metal lines 303, and a fourth dielectric layer 310 is deposited onto the third dielectric layer 308. As above, suitable materials for dielectric layers 306, 308 and 310 include, but are not limited to, oxide materials such as $SiO_2$ and/or SiOC and/or nitride materials such as SiN and/or SiOCN. A process such as CVD, ALD or PVD can be used to deposit the dielectric layers 306, 308 and 310. According to an exemplary embodiment, dielectric layers 306, 308 and 310 each have a thickness of from about 500 nm to about 2 μm, and ranges therebetween.

Standard lithography and etching techniques (see above) are then used to pattern trenches 312 in dielectric layers 308 and 310. As shown in FIG. 3, trenches 312 extend through the dielectric layer 308 and dielectric layer 310 down to metal lines 303. A directional (i.e., anisotropic) etching process such as RIE can be employed for the trench etch.

A thin seed layer 314 is then deposited onto dielectric layer 310, lining the trenches 312. Seed layer 314 will enable electroplating of a metal(s) into trenches 312 to form pads 318 on the bridge chip wafer 300 (see below). Suitable materials for seed layer 314 include, but are not limited to, Cu and/or Cu-containing alloys such as copper-titanium (CuTi) and/or copper-manganese (CuMn). A process such as CVD, ALD, PVD, evaporation or sputtering can be used to deposit seed layer 314 onto dielectric layer 310. According to an exemplary embodiment, seed layer 314 has a thickness of from about 0.5 nm to about 100 nm and ranges therebetween.

A patterned photoresist mask 316 is then formed on the bridge chip wafer 300 over the seed layer 314. Standard lithography techniques can be employed to form the photoresist mask 316 on bridge chip wafer 300. For instance, a casting process such as spin-coating or spray coating is used to deposit a photoresist material onto the wafer, which is then baked (i.e., a post-apply bake) to remove excess solvent. An exposure and development process is then performed to pattern the photoresist over the trenches 312 with the footprint and location of the pads 318.

A metal(s) such as Cu is then electroplated through the patterned photoresist mask 316 to form (e.g., Cu) pads 318 on a front side of the bridge chip wafer 300. According to an exemplary embodiment, the electroplated metal contains copper (Cu) such that Cu pads 318 are formed on the bridge chip wafer 300. However, embodiments are also contemplated herein where the pad structure includes layers of different metals. For instance, an underplated metal (not shown) such as nickel can be employed below the Cu and/or an overplated metal (not shown) such as gold (Au) and/or silver (Ag) can be deposited over the Cu for corrosion resistance. In either case, the bonds between the pads 318 and the pillars on the logic/memory chips are referred to herein as Cu-to-Cu bonds as the bulk of the pads/pillars is formed from Cu.

Following the electroplating, the photoresist mask 316 is removed. By way of example only, a common photoresist remover such as acetone can be used to remove the photoresist mask 316. The seed layer 314 is then etched to avoid shorts between adjacent pads 318 (see, e.g., FIG. 4—described below).

Figure 4:
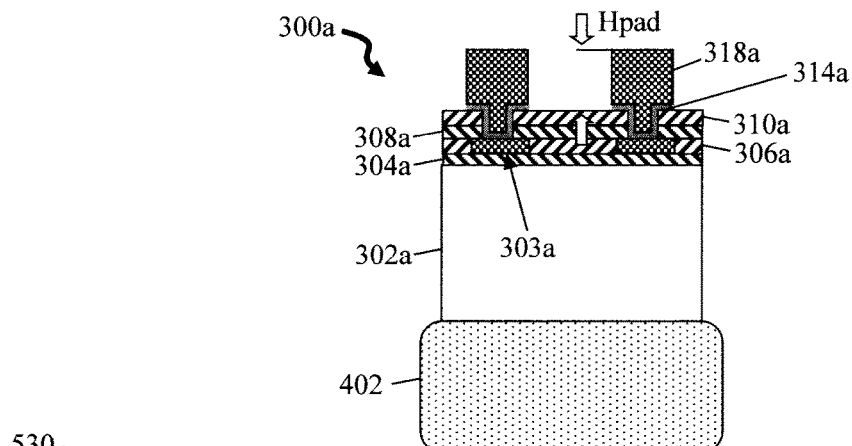
FIG. 4 is a cross-sectional diagram illustrating the bridge chip wafer having been diced into individual bridge chips and a first fixture having been attached to a back side of the bridge chip according to an embodiment of the present invention.

The bridge chip wafer 300 is then is diced into multiple individual bridge chips 300a. See, e.g., bridge chip 300a shown in FIG. 4. The components of the bridge chip wafer 300 present in each of the individual bridge chips 300a is now given the designation 'a'. Thus, for instance, the portion of semiconductor substrate 302 in each individual bridge chip 300a is given the reference numeral 302a, the portions of dielectric layers 304, 306, 308 and 310 are given the reference numerals 304a, 306a, 308a and 310a, respectively, and so on. As shown in FIG. 4, the seed layer 314a has been etched to avoid shorting between adjacent pads 318a on the front side of the bridge chip 300a.

In the present example, the pads 318a on bridge chip 300a each have approximately the same height Hpad (see FIG. 4). As will be described in detail below, this configuration will enable the symmetric integration of logic/memory chips of varying sizes to the bridge chip 300a and the packaging substrate using hanging pillars from logic/memory chips. However, this configuration is merely provided as an example. For instance, it is also possible to create pads 318a on bridge chip 300a at varying heights, if so desired (e.g., to compensate for a varying topography amongst the logic/memory chips).

A (first) fixture 402 is then attached to a back side of the bridge chip 300a. See, FIG. 4 where fixture 402 is attached to the semiconductor substrate 302a of bridge chip 300a. In the present example, fixture 402 needs to be narrow enough to allow for the hanging pillars of the logic/memory chips to be bonded to the packaging substrate. Namely, as highlighted above, the pillars on the logic/memory chips hang over the packaging substrate on either side of the bridge chip 300a.

Preferably, fixture 402 is formed from a material that is transparent to laser radiation, ultraviolet (UV) radiation, optical radiation and/or infrared (IR) radiation. In that case, suitable materials for fixture 402 include, but are not limited to, glass, silicon and/or other such material. According to an exemplary embodiment, fixture 402 is glass plate or silicon wafer that is attached to bridge chip 300a using a temporary bonding material. By way of example only, suitable temporary bonding materials are commercially-available from Brewer Science, Inc., Rolla, Mo. and from the 3M Company, St. Paul, Minn. Optionally, the bonding adhesive used is a light-releasable adhesive such as UV tape. Suitable light-releasable adhesive materials are commercially available, for example, from Furukawa Electric Co., LTD., Tokyo, Japan.

As will be described in detail below, fixture 402 will be removed/debonded from the bridge chip 300a later on in the process to enable bonding of the hanging pillars to the packaging substrate. To do so, in one exemplary embodiment the bonding adhesive is dissolved in an organic solvent such as N-Methyl-2-Pyrrolidone (NMP) to reverse the bond. In that case, the fixture 402 should be resistant to the organic solvent in order to prevent introducing any undue mechanical stress during debonding. For example, the use of glass for the fixture 402 will provide this solvent resistance. Alternatively, with a (laser/UV/optical/IR) transparent fixture 402 (see above) a light releasable adhesive such as UV tape (see above) can be employed, whereby laser/UV/optical/IR light is provided through the transparent fixture 402 to release/debond fixture 402 from bridge chip 300a. See below. This debonding can occur based on a chemical reaction that occurs in the presence of light such as the UV curing that occurs when UV tape is exposed to UV light and/or ablation that occurs when the adhesive is irradiated with laser light. Suitable adhesives that can be ablated by laser light include, but are not limited to, polyimide-based adhesives such as are commercially available from HD MicroSystems, Parlin, N.J., polyimide-based materials, etc.

Figure 5:
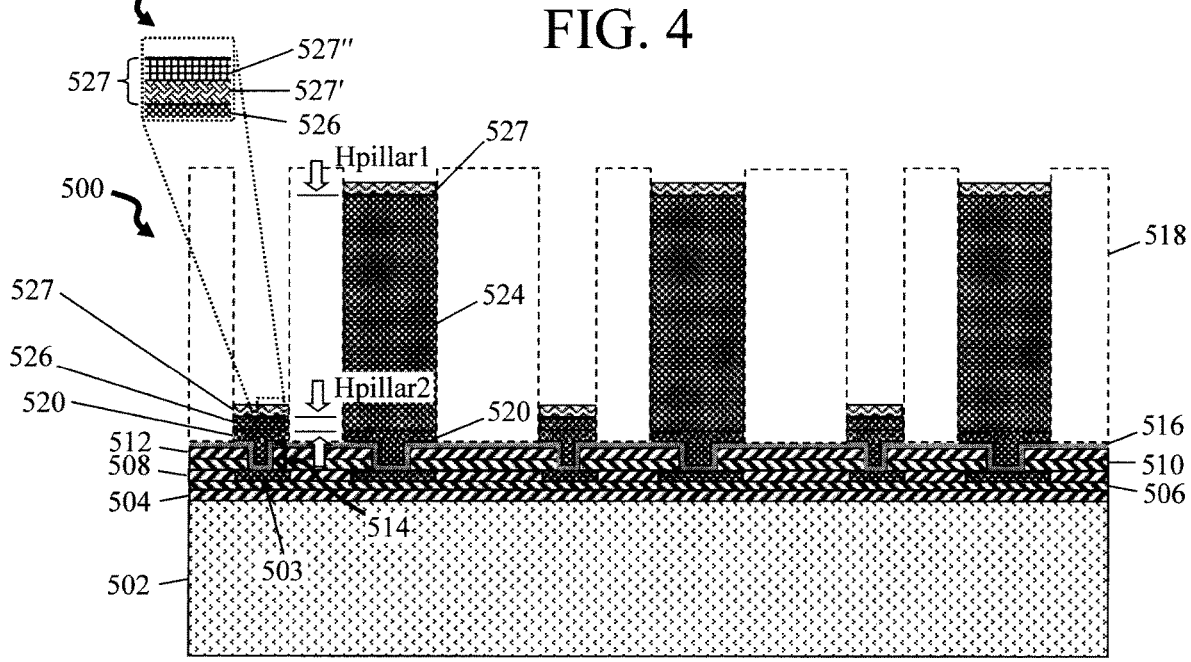
FIG. 5 is a cross-sectional diagram illustrating a logic or memory wafer according to an embodiment of the present invention.

Logic and memory wafers are then built (see FIG. 5). For illustrative purposes only, FIG. 5 depicts the fabrication of a given logic or memory wafer 500. However, the same processes can be employed to fabricate additional logic or memory wafers, potentially with varying dimensions (e.g., chips of varying heights). As shown in FIG. 5, logic or memory wafer 500 is built on a semiconductor substrate 502, for example, a bulk Si, bulk Ge, bulk SiGe and/or bulk III-V semiconductor wafer, or a Si, Ge, SiGe, and/or a III-V semiconductor SOI wafer (see above). According to an exemplary embodiment, semiconductor substrate 502 has pre-built structures (not shown) such as transistors, diodes, capacitors, resistors, isolation regions (e.g., shallow trench isolation (STI) regions), interconnects, wiring, etc. For instance, in one exemplary embodiment, semiconductor substrate 502 is a commercially-available logic or memory wafer, i.e., containing logic or memory devices and associated components. As provided above, chips obtained from different sources oftentimes have different dimensions. However, the present integration techniques accommodate for these dimensional variations.

Standard metallization techniques are then employed to form metal lines 503 on semiconductor substrate 502. By way of example only, metal lines 503 can be part of an RDL layer on semiconductor substrate 502. According to an exemplary embodiment, a first dielectric layer 504 and a second dielectric layer 506 are deposited onto semiconductor substrate 502. As provided above, suitable materials for dielectric layers 504 and 506 include, but are not limited to, oxide materials such as $SiO_2$ and/or SiOC and/or nitride materials such as SiN and/or SiOCN. A process such as CVD, ALD or PVD can be used to deposit dielectric layers 504 and 506 onto semiconductor substrate 502. According to an exemplary embodiment, dielectric layers 504 and 506 each have a thickness of from about 500 nm to about 2 μm, and ranges therebetween.

Metal lines 503 are then formed on dielectric layer 506. According to an exemplary embodiment, metal lines 503 are formed by first depositing a contact metal onto dielectric layer 506. Standard lithography and etching techniques (see above) are then used to pattern the contact metal into the individual metal lines 503. Alternatively, metal lines 503 can be formed using a standard damascene process well known to those skilled in the art. As provided above, suitable contact metals include, but are not limited to, Cu, Co, Ru and/or W. According to an exemplary embodiment, metal lines 503 have a thickness of from about 5 nm to about 0.5 μm and ranges therebetween.

A third dielectric layer 508 is then deposited onto the dielectric layer 506 surrounding the metal lines 503, a fourth dielectric layer 510 is deposited onto the dielectric layer 508 and metal lines 503, and a fifth dielectric layer 512 is deposited onto dielectric layer 510. As above, suitable materials for dielectric layers 508, 510 and 512 include, but are not limited to, oxide materials such as $SiO_2$ and/or SiOC and/or nitride materials such as SiN and/or SiOCN. A process such as CVD, ALD or PVD can be used to deposit the dielectric layers 508, 510 and 512. According to an exemplary embodiment, dielectric layers 508, 510 and 512 each have a thickness of from about 500 nm to about 2 μm, and ranges therebetween.

Standard lithography and etching techniques (see above) are then used to pattern trenches 514 in dielectric layers 510 and 512. As shown in FIG. 5, trenches 514 extend through the dielectric layer 510 and dielectric layer 512 down to metal lines 503. A directional (i.e., anisotropic) etching process such as RIE can be employed for the trench etch.

A thin seed layer 516 is then deposited onto dielectric layer 512, lining the trenches 514. Seed layer 516 will enable electroplating of a metal(s) into trenches 514 to form pillars 524 and 526 on the logic or memory wafer 500 (see below). As provided above, suitable materials for seed layer 516 include, but are not limited to, Cu and/or Cu-containing alloys such as CuTi and/or CuMn. A process such as CVD, ALD, PVD, evaporation or sputtering can be used to deposit seed layer 516 onto dielectric layer 512. According to an exemplary embodiment, seed layer 516 has a thickness of from about 0.5 nm to about 100 nm and ranges therebetween.

A patterned photoresist mask 518 is then formed on the logic or memory wafer 500 over the seed layer 516. Standard lithography techniques can be employed to form the photoresist mask 518 logic or memory wafer 500. See above. A metal(s) is then electroplated through the patterned photoresist mask 518 to form pillars 524 and 526 on the logic or memory wafer 500. According to an exemplary embodiment, a base metal 520 is first plated onto the logic or memory wafer 500 through photoresist mask 518. According to an exemplary embodiment, the base metal 520 is Cu.

Electroplating of a metal(s) (e.g., Cu) through the patterned photoresist mask 518 is then used to form (first/second) pillars 524 and 526 on the front side of the logic or memory wafer 500 over the base metal 520. As shown in FIG. 5, pillars 524 and 526 have differing heights, Hpillar1 and Hpillar2, respectively, where Hpillar1>Hpillar2. As provided above, features of varying heights such as pillars 524 and 526 can be formed using multiple, consecutive electroplating steps, each of which involves a photoresist mask. Alternatively, a shield (as described in U.S. patent application Ser. No. 16/703,173) can be placed over the logic or memory wafer 500 during electroplating to alter the local deposition rates for those portions of the logic or memory wafer 500 covered by the shield as compared to other portions of the logic or memory wafer 500 the shield leaves uncovered. As such, pillars 524 and 526 of varying heights can be formed simultaneously on the logic or memory wafer 500. Optionally, an underplating metal 527 is then plated onto the pillars 524 and 526 through photoresist mask 518. As shown in magnified view 530 in FIG. 5, according to an exemplary embodiment, underplating metal 527 is a multi-layer stack including a first metal layer 527' plated onto the pillars 524 and 526, and a second metal layer 527" plated onto the first metal layer 527'. In one embodiment, first metal layer 527' is nickel (Ni) and second metal layer 527" is Cu. That way, a Cu-to-Cu bond can be used to join pillar 526 (i.e., via the Cu second metal layer 527") to the bridge chip (see below). According to an exemplary embodiment, first metal layer 527' and second metal layer 527" each has a thickness of from about 1 µm to about 3 µm and ranges therebetween.

Following the electroplating, the photoresist mask 518 is removed. By way of example only, a common photoresist remover such as acetone can be used to remove the photoresist mask 518. The seed layer 516 is then etched to avoid shorts between adjacent pillars 524 and 526 (see, e.g., FIG. 6—described below).

Figure 6:
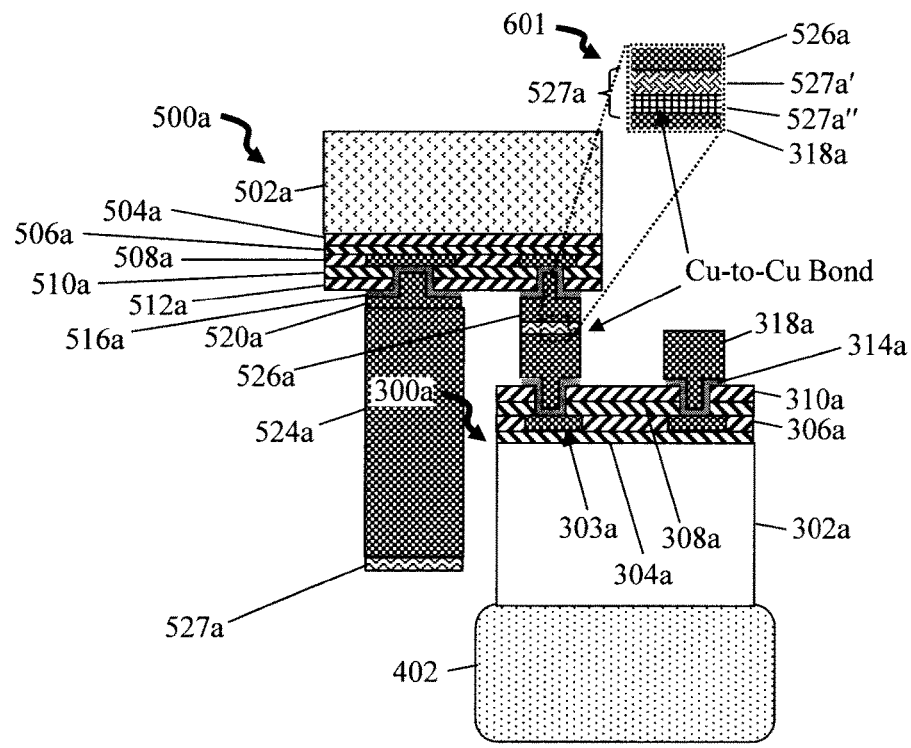
FIG. 6 is a cross-sectional diagram illustrating the logic or memory wafer having been diced into individual logic or memory chips, and an individual logic or memory chip having been bonded to the bridge chip via a Cu-to-Cu bond between a Cu pad on the bridge chip and a Cu pillar on the logic or memory chip according to an embodiment of the present invention.

The logic or memory wafer 500 is then is diced into multiple individual logic or memory chips 500a. See, e.g., chip 500a shown in FIG. 6 which is either a logic chip or a memory chip. The components of the logic or memory wafer 500 present in each of the individual chips 500a is now given the designation 'a'. Thus, for instance, the portion of semiconductor substrate 502 in each individual chip 500a is given the reference numeral 502a, the portions of dielectric layers 504, 506, 508, 510 and 512 are given the reference numerals 504a, 506a, 508a, 510a and 512a, respectively, and so on. As shown in FIG. 6, the seed layer 516a on the front side of chip 500a has been etched to avoid shorting between adjacent pillars 524a and 526a.

Chip 500a is then inverted to position the front side of chip 500a facing the front side of the bridge chip 300a. Chip 500a is then joined to bridge chip 300a via a Cu-to-Cu bond between a first one of the pads 318a on bridge chip 300a and pillar 526a of chip 500a. See FIG. 6. According to an exemplary embodiment, the Cu-to-Cu bonding is carried out using a thermo-compressive bonding process. As provided above, thermo-compressive bonding involves bringing the pad 318a and pillar 526a into physical contact with one another under conditions sufficient to from a Cu-to-Cu bond therebetween. According to an exemplary embodiment, the conditions include a temperature of from about 300° C. to about 400° C. and ranges therebetween, and a pressure of greater than or equal to about 10 kN/m$^2$, e.g., from about 10 kN/m$^2$ to about 1 MN/m$^2$ and ranges therebetween. Notably, at this stage in the process, no solder is present on any of the chips. As provided above, there can be an optional underplating metal 527 plated onto the pillars 524 and 526, having a first metal layer 527' (e.g., Ni) and a second metal layer 527" (e.g., Cu). In that case, the Cu-to-Cu bond is formed between the second metal (Cu) layer 527" and the pad 318a (see, for example, the magnified view 601 in FIG. 6).

The pillar 526a of chip 500a used for the Cu-to-Cu bonding to bridge chip 300a is shorter than the pillar 524a which will be used for bonding to the packaging substrate (see below). Thus, as shown in FIG. 6, chip 500a is inverted (for bonding to bridge chip 300a) with the longer 'hanging' pillar 524a positioned off to one side (i.e., a first side) of the bridge chip 300a. The longer length of pillar 524a will enable pillar 524a to access the packaging substrate which will be positioned beneath the back side of bridge chip 300a.

Figure 7:
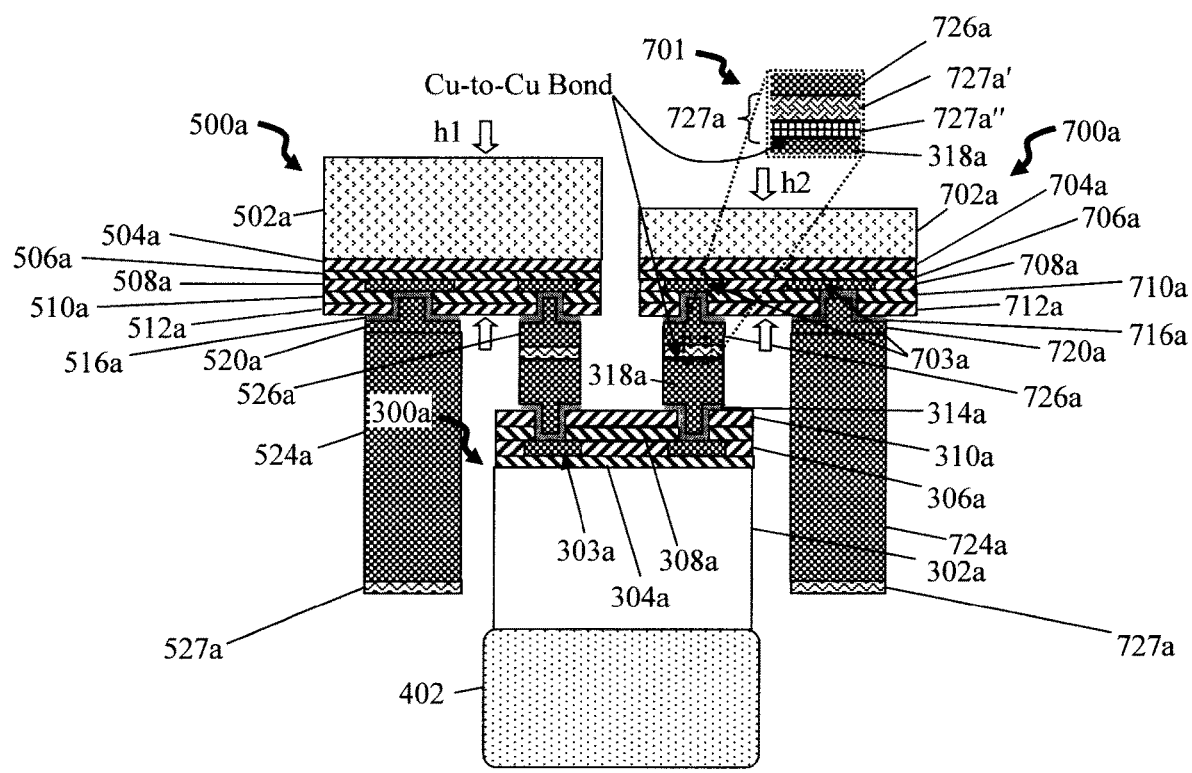
FIG. 7 is a cross-sectional diagram illustrating another logic or memory chip having been bonded to the bridge chip via a Cu-to-Cu bond to form a multi-chip structure, wherein longer Cu pillars of the chips overhang opposite sides of the bridge chip according to an embodiment of the present invention.
Figure 8:
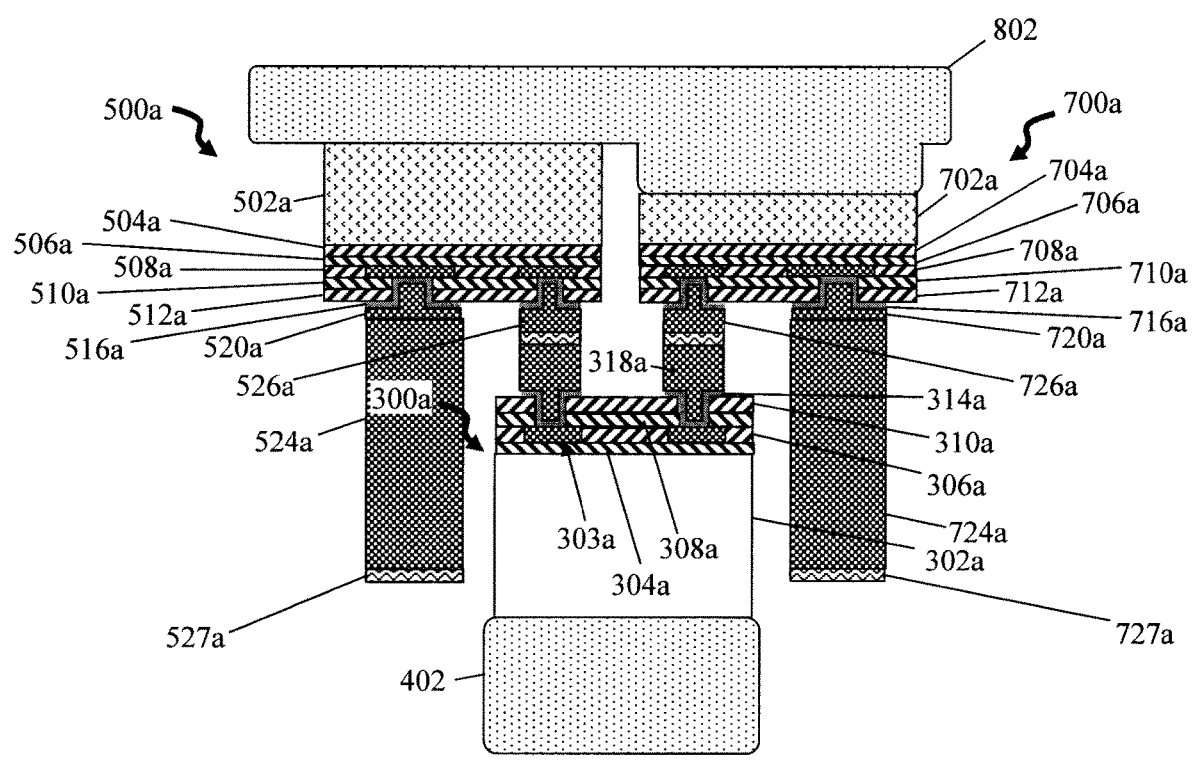
FIG. 8 is a cross-sectional diagram illustrating a second fixture having been attached to a back side of the logic or memory chips according to an embodiment of the present invention.
Figure 9:
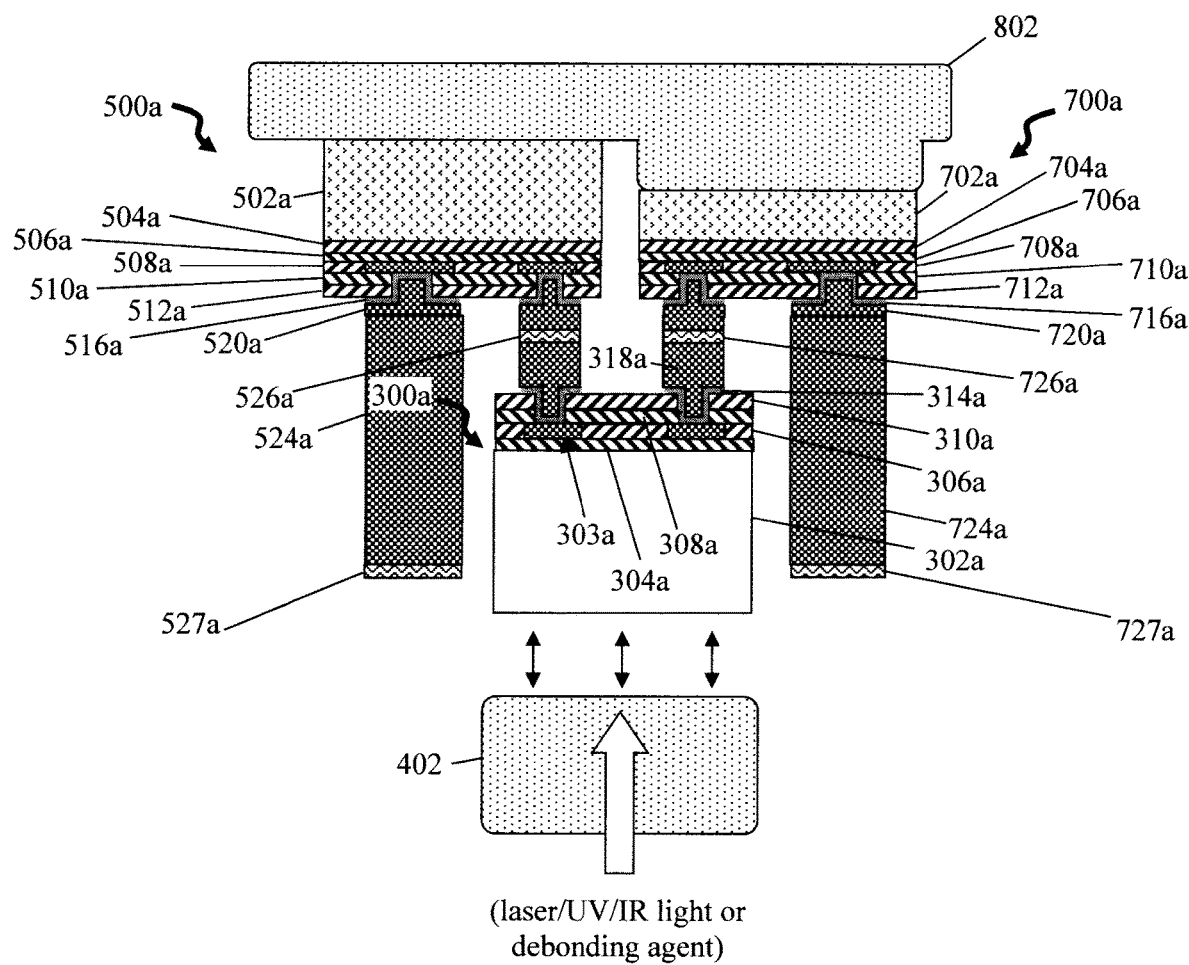
FIG. 9 is a cross-sectional diagram illustrating the first fixture having been removed from the back side of the bridge chip according to an embodiment of the present invention.

A second (logic or memory) wafer is prepared in the same manner as described in conjunction with the description of FIG. 5 above, which is diced into individual logic or memory chips 700a. See FIG. 7. Thus, each chip 700a includes a semiconductor substrate 702a, dielectric layers 704a, 706a, 708a, 710a and 712a disposed on the semiconductor substrate 702a with metal lines 703a embedded therein, trenches in the dielectric layers 710a and 712a over the metal lines 703a, a seed layer 716a lining the trenches, a base metal 720a plated into the trenches, and (first/second) pillars 724a and 726a plated over the base metal 720a on a front side of the chip 700a. As shown in FIG. 7, the seed layer 716a on the front side of chip 700a has been etched to avoid shorting between adjacent pillars 724a and 726a.

As described in conjunction with the description of chip 500a above, chip 700a can optionally have an underplating metal 727a plated onto the pillars 724a and 726a. As shown in magnified view 701 in FIG. 7, according to an exemplary embodiment, underplating metal 727a is a multi-layer stack including a first metal layer 727a' plated onto the pillars 724a and 726a, and a second metal layer 727a" plated onto the first metal layer 727a'. In one embodiment, first metal layer 727a' is Ni and second metal layer 727a" is Cu. That way, a Cu-to-Cu bond can be used to join pillar 726a (i.e., via the Cu second metal layer 727a") to the bridge chip (see below). According to an exemplary embodiment, first metal layer 727a' and second metal layer 727a" each has a thickness of from about 1 µm to about 3 µm and ranges therebetween.

Chip 700a can have different dimensions from chip 500a. For instance, chip 500a has a height h1 and chip 700a has a height h2, where h1>h2. However, the way in which pillars 524a/526a and pillars 724a/726a are built on top of chips 500a and 700a, respectively, and are inverted to integrate chips 500a and 700a with the bridge chip 300a and the packaging substrate beneath the back side of bridge chip 300a (see below) makes the height of the individual chips 500a and 700a immaterial to the bonding scheme.

As shown in FIG. 7, chip 700a is then inverted to position the front side of chip 700a facing the front side of the bridge chip 300a. Chip 700a is then joined to bridge chip 300a via a Cu-to-Cu bond between a second one of the pads 318a on bridge chip 300a and pillar 726a of chip 700a. According to an exemplary embodiment, the Cu-to-Cu bonding is carried out using a thermo-compressive bonding process. As provided above, thermo-compressive bonding involves bringing the pad 318a and pillar 726a into physical contact with one another under conditions sufficient to bond these structures together. According to an exemplary embodiment, the conditions include a temperature of from about 300° C. to about 400° C. and ranges therebetween, and a pressure of greater than or equal to about 10 kN/m$^2$, e.g., from about 10 kN/m$^2$ to about 1 MN/m$^2$ and ranges therebetween. Notably, at this stage in the process, no solder is present on any of the chips.

In the same manner as described above, the pillar 726a of chip 700a used for the Cu-to-Cu bonding to bridge chip 300a is shorter than the pillar 724a which will be used for bonding to the packaging substrate (see below). Thus, as shown in FIG. 7, chip 700a is inverted (for bonding to bridge chip 300a) with the longer 'hanging' pillar 724a positioned off to a second side of the bridge chip 300a opposite pillar 524a of chip 500a. The longer length of pillar 724a will enable pillar 724a to access the packaging substrate which will be positioned beneath the back side of bridge chip 300a.

A (second) fixture 802 is then attached to the back side of chips 500a and 700a. See FIG. 8. According to an exemplary embodiment, fixture 802 is a vacuum chuck that uses suction to attach itself to the back side of chips 500a and 700a. The vacuum chuck can be a single piece or dual piece vacuum head/handler that attaches on the back side of the chips 500a and 700a while the stress-free debonding of fixture 402 with the bridge chip 300a is achieved by using a solvent or laser/UV/IR debonding/ablation (see above). A single fixture 802 can attach through vacuum chucking if the alignment and tilt tolerances of the two bonded chips allow it. Otherwise, separate fixture heads can attach to each chip 500a and 700a through vacuum chucking as described.

In order to enable bonding of the multi-chip structure (i.e., bridge chip 300a/chip 500a/chip 700a) to the packaging substrate, fixture 402 is removed from the back side of bridge chip 300a. See FIG. 9. As provided above, when fixture 402 is formed from a transparent material, fixture 402 can be debonded/released from bridge chip 300a via a light-releasable adhesive material using laser/UV/optical/IR radiation for UV curing, ablation, etc. Alternatively, the bonding adhesive can be dissolved in an organic solvent such as N-Methyl-2-Pyrrolidone (NMP) to debonded/released fixture 402 from bridge chip 300a.

Figure 10:
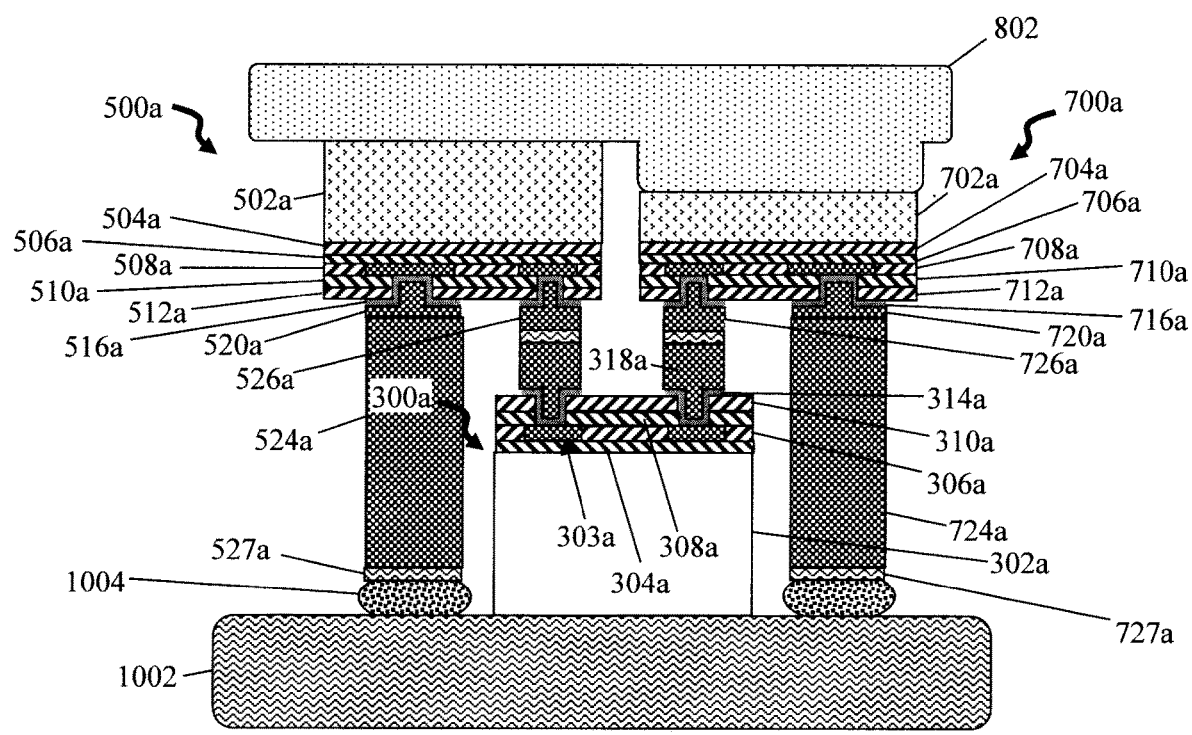
FIG. 10 is a cross-sectional diagram illustrating the multi-chip structure having been bonded to a packaging substrate via solder bonds according to an embodiment of the present invention.
Figure 11:
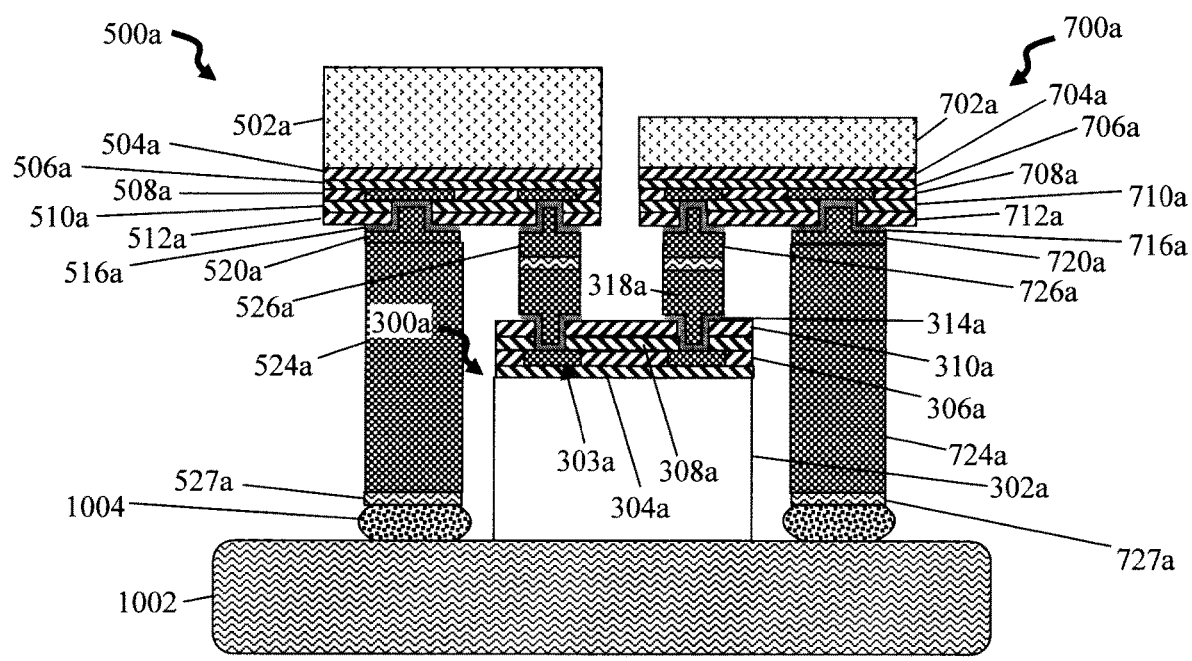
FIG. 11 is a cross-sectional diagram illustrating the second fixture having been removed from the back side of the logic or memory chips according to an embodiment of the present invention.

The multi-chip structure (i.e., bridge chip 300a/chip 500a/chip 700a) is then assembled to packaging substrate 1002. See FIG. 10. As shown in FIG. 10. Solder bumps 1004 are used for assembly to the packaging substrate 1002. As highlighted above, solder bonding advantageously provides a level of compensation for warpage, non-flatness, and/or non-planarity issues in the package. According to an exemplary embodiment, the solder bumps 1004 include Sn, Ag, Cu, and/or alloys thereof such as SnAg solder and/or SnAgCu solder.

For bonding, the packaging substrate 1002 is oriented facing the back side of bridge chip 300a. As described above, the chips 500a and 700a have been inverted to position the front sides of chips 500a and 700a facing the front side of the bridge chip 300a, and have been joined to bridge chip 300a via a Cu-to-Cu bond between the pads 318a on bridge chip 300a and pillars 526a and 726a of chips 500a and 700a, respectively. This configuration positions the longer 'hanging' pillars 524a and 724a off to opposite sides of the bridge chip 300a, overhanging the packaging substrate 1002. The (e.g., preformed) solder bumps 1004 on packing substrate 1002 can then bond with the pillars 524a and 724a on opposite sides of the bridge chip 300a.

The fixture 802 is then detached from the back side of chips 500a and 700a. See FIG. 11. As provided above, fixture 802 can be a simple vacuum chuck that uses suction to attach itself to the back side of chips 500a and 700a. Such a vacuum chuck holds the multi-chip structure (i.e., bridge chip 300a/chip 500a/chip 700a) in place during debonding of fixture 402 from the bridge chip 300a and during bonding of the multi-chip structure to the packaging substrate 1002. Release of the vacuum is then used to detach the vacuum chuck from chips 500a and 700a.

Optionally, the entire structure can be encased in an underfill encapsulant (not shown) to provide structural integrity. Suitable encapsulation materials include, but are not limited to, cyanate esters.

The present techniques can be extended to parallel assembly on a large workpiece for processing a plurality of multi-chip structures. See, for example, FIGS. 12-16. In the description that follows, the same bridge chips 300a, logic/memory chips 500a and 700a and packing substrate 1002 configured in the same manner as above will be used and numbered alike in the figures. Thus, reference can be made to the example above for a detailed description of each of the components of bridge chip 300a, logic/memory chips 500a and 700a and packaging substrate 1002.

Figure 12:
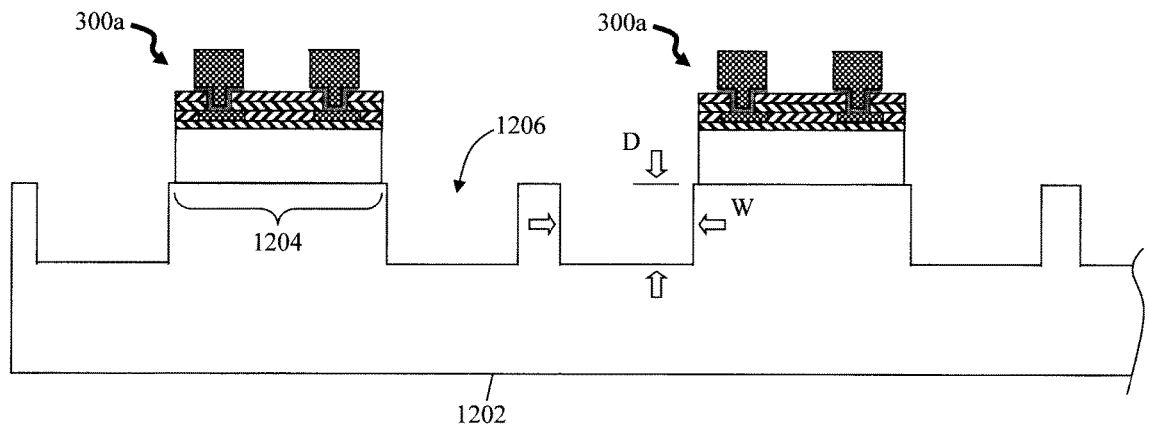
FIG. 12 is a cross-sectional diagram illustrating, according to an alternative embodiment, individual bridge chips having been attached to a wafer according to an embodiment of the present invention.
Figure 13:
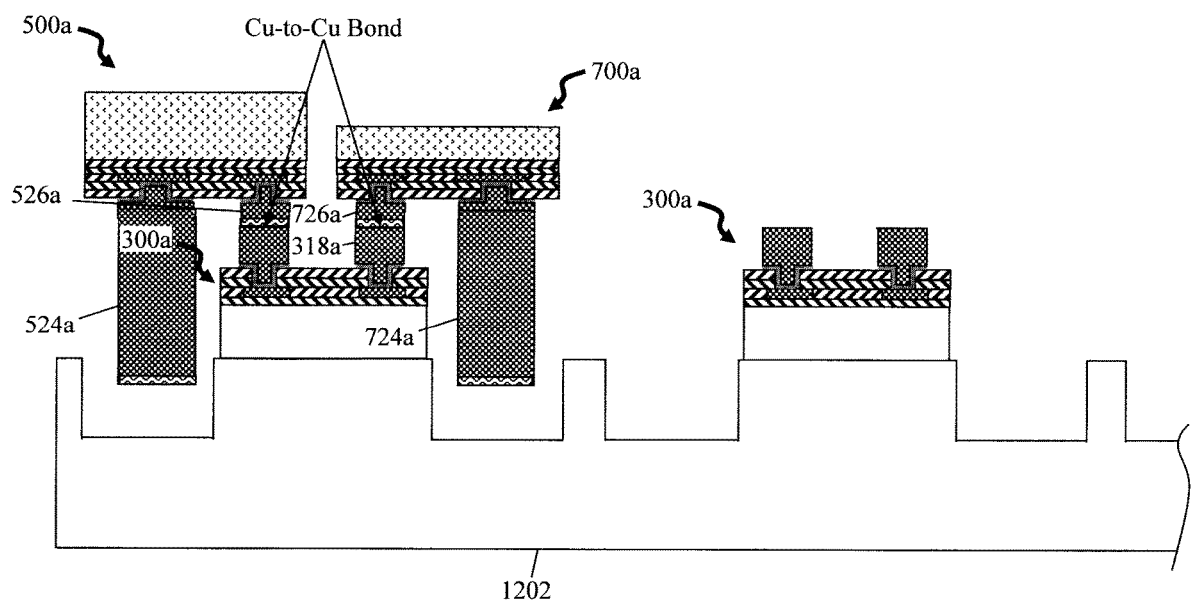
FIG. 13 is a cross-sectional diagram illustrating an individual logic or memory chip having been bonded to one of the bridge chips via a Cu-to-Cu bond according to an embodiment of the present invention.
Figure 14:
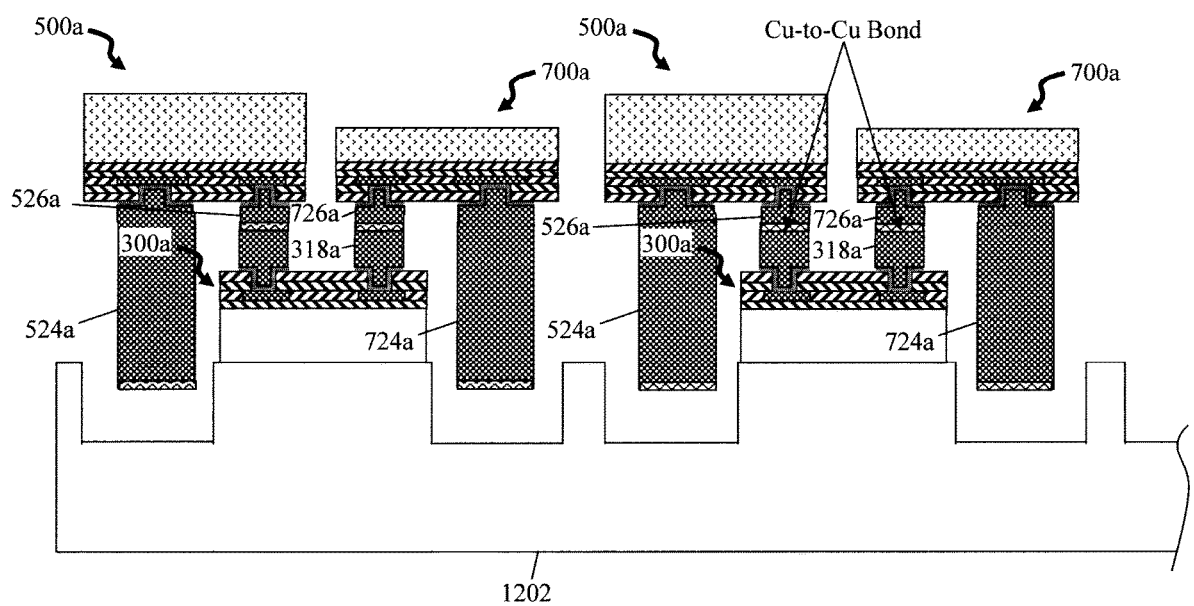
FIG. 14 is a cross-sectional diagram illustrating a logic or memory chip having been bonded to another one of the bridge chips via a Cu-to-Cu bond according to an embodiment of the present invention.
Figure 15:
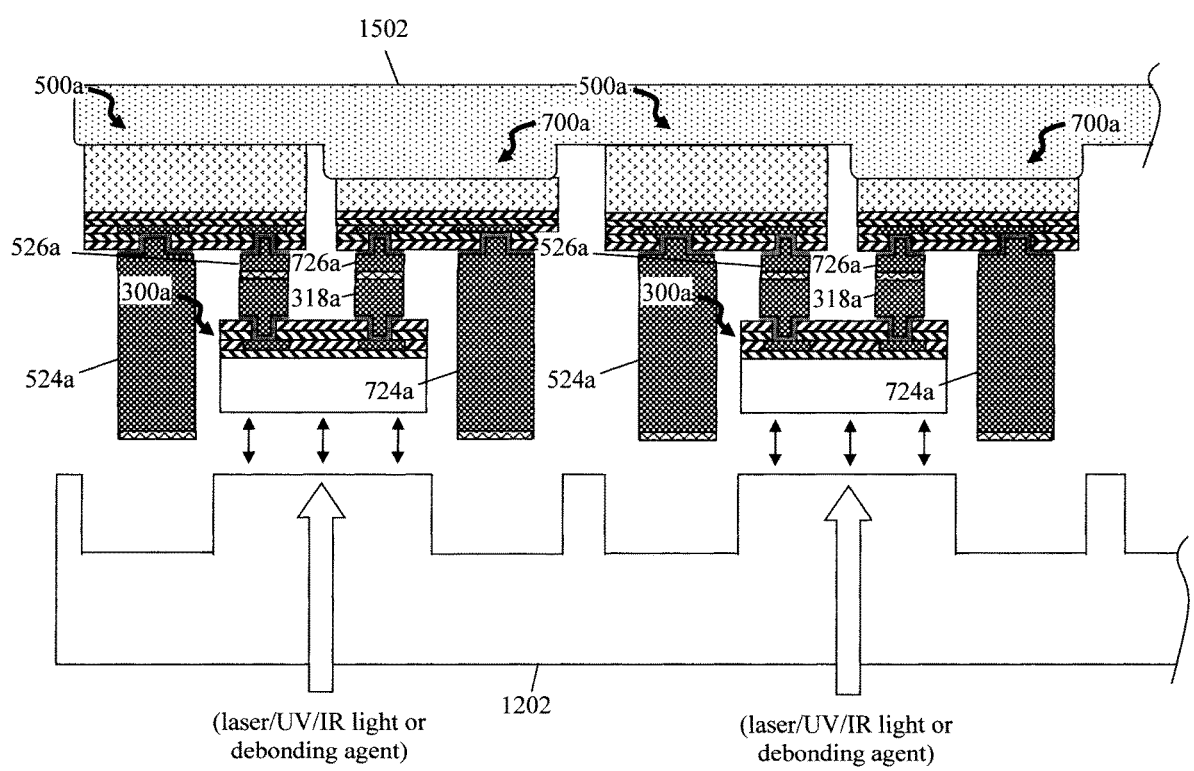
FIG. 15 is a cross-sectional diagram illustrating a first fixture having been attached to a back side of the logic or memory chips, and the bridge chips having been removed from the wafer according to an embodiment of the present invention.
Figure 16:
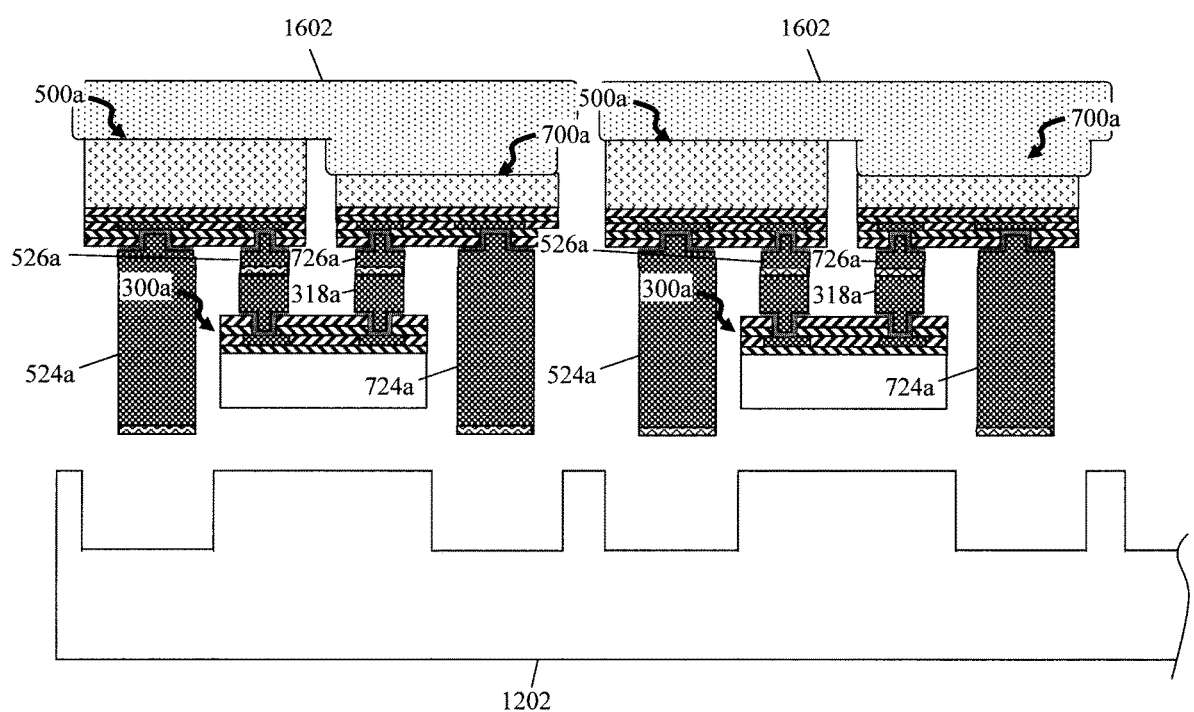
FIG. 16 is a cross-sectional diagram illustrating a second fixture being used to select individual multi-chip structures according to an embodiment of the present invention.

As shown in FIG. 12, instead of attaching each bridge chip 300a to a separate fixture, in this example, individual bridge chips 300a are attached to a wafer 1202 that has bond points 1204 for each of the bridge chips 300a. Advantageously, employing a wafer 1202 that is large enough to accommodate several parallel sub-assemblies increases the overall assembly throughput and reduces cost. According to an exemplary embodiment, bridge chips 300a are attached to wafer 1202 using a bonding adhesive that can be reversed using a solvent such as NMP, or optionally a UV curable or laser ablate-able adhesive. See above.

Thus, in some embodiments, the wafer 1202 is formed from a material that is transparent to (UV/IR/optical/laser) light. As provided above, suitable transparent materials include, but are not limited to, glass and/or silicon. As shown in FIG. 12, wafer 1202 is patterned to form recesses 1206 on either side of the bond points 1204. As such, bond points 1204 can be present at the tops of pedestal structures between the recesses 1206. According to an exemplary embodiment, the recesses 1206 each have a width W of from about 1 millimeter (mm) to about 10 mm and ranges therebetween, and a depth D of from about 100 micrometers (μm) to about 300 μm and ranges therebetween. The recesses 1206 will serve to accommodate the hanging pillars 524a and 724a off to opposite sides of the bridge chip 300a (see above).

Next, in the same manner as described above, Cu-to-Cu bonding is used to bond chips 500a and 700a to the (first) bridge chip 300a. See FIG. 13. As described above, this involves inverting chips 500a and 700a to position the front side of chips 500a and 700a facing the front side of the bridge chip 300a. The chips 500a and 700a are then joined to bridge chip 300a via a Cu-to-Cu bond between the pads 318a on bridge chip 300a and pillars 526a and 726a of chips 500a and 700a. According to an exemplary embodiment, the Cu-to-Cu bonding is carried out using a thermo-compressive bonding process performed, e.g., at a temperature of from about 300° C. to about 400° C. and ranges therebetween, and a pressure of greater than or equal to about 10 kN/m$^2$, e.g., from about 10 kN/m$^2$ to about 1 MN/m$^2$ and ranges therebetween. Notably, at this stage in the process, no solder is present on any of the chips.

As provided above, there can be an optional underplating metal 527 having a Ni layer plated onto the pillars 524a/526a and 724a/726a, and a Cu layer plated onto the Ni layer (see, e.g., the descriptions of FIG. 5 and FIG. 7, above). In that case, the Cu-to-Cu bond is formed between the Cu layer and the pad 318a.

The process is then repeated x times to bond chips 500a and 700a to the next x bridge chip 300a on wafer 1202. See FIG. 14. In the same manner as described above, a fixture 1502 (e.g., a vacuum chuck) is attached to the back side of chips 500a and 700a, and the wafer 1202 is detached from the back side of bridge chips 300a. See FIG. 15. As provided above, when wafer 1202 is formed from a transparent material, wafer 1202 can be debonded/released from bridge chips 300a via a light-releasable adhesive material using laser/UV/optical/IR radiation for UV curing, ablation, etc. Alternatively, the bonding adhesive can be dissolved in an organic solvent such as N-Methyl-2-Pyrrolidone (NMP) to debond/release wafer 1202 from bridge chips 300a.

The fixture 1502 can then be detached from the back side of chips 500a and 700a (e.g., by reducing the vacuum). A smaller vacuum chuck fixture 1602 can then be used to select individual multi-chip structures (i.e., bridge chip 300a/chip 500a/chip 700a) for assembly to the packaging substrate. See FIG. 16. Once selected, the remainder of the process for solder bonding each individually-selected the multi-chip structure (i.e., bridge chip 300a/chip 500a/chip 700a) to a packaging substrate 1002 is the same as that described in conjunction with the description of FIG. 10 and FIG. 11, above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an interconnect structure, the method comprising the steps of:
    bonding individual chips to at least one bridge chip via copper (Cu)-to-Cu bonding to form a multi-chip structure; and
    bonding the multi-chip structure to a packaging substrate via solder bonding, after the Cu-to-Cu bonding has been performed, to form the interconnect structure comprising the individual chips bonded to the at least one bridge chip and to the packaging substrate.

2. The method of claim 1, wherein the individual chips comprise logic chips or memory chips.

3. The method of claim 1, wherein the individual chips have varying dimensions.

4. The method of claim 1, further comprising the steps of:
    forming Cu pads on a front side of the at least one bridge chip;
    forming at least a first Cu pillar and a second Cu pillar on a front side of each of the individual chips; and
    bonding the individual chips to the at least one bridge chip via Cu-to-Cu bonding between the Cu pads of the at least one bridge chip and the second Cu pillar of each of the individual chips.

5. The method of claim 4, further comprising the step of:
    inverting the individual chips to position the front side of the individual chips facing the front side of the at least one bridge chip.

6. The method of claim 4, further comprising the step of:
    contacting the Cu pads of the at least one bridge chip and the second Cu pillar of each of the individual chips under conditions sufficient to form a bond therebetween.

7. The method of claim 6, wherein the conditions comprise a temperature and a pressure.

8. The method of claim 7, wherein the temperature is from about 300° C. to about 400° C. and ranges therebetween.

9. The method of claim 7, wherein the pressure is from about 10 kiloNewton per square meter ($kN/m^2$) to about 1 MegaNewton per square meter ($MN/m^2$) and ranges therebetween.

10. The method of claim 4, wherein the first Cu pillar has a height Hpillar1 and the second Cu pillar has a height Hpillar2, wherein Hpillar1>Hpillar2.

11. The method of claim 10, wherein the first Cu pillar of each of the individual chips hangs off to a side of the at least one bridge chip.

12. The method of claim 10, further comprising the step of:
    bonding the first Cu pillar of each of the individual chips to the packaging substrate via solder bonding.

13. The method of claim 1, further comprising the steps of:
    attaching a first fixture to a back side of the at least one bridge chip prior to bonding the individual chips to the at least one bridge chip; and
    removing the first fixture from the back side of the at least one bridge chip prior to bonding the multi-chip structure to the packaging substrate.

14. The method of claim 13, wherein the first fixture is attached to the back side of the at least one bridge chip using an adhesive.

15. The method of claim 13, wherein the first fixture is transparent.

16. The method of claim 13, further comprising the step of:
    attaching a second fixture to a back side of the individual chips prior to removing the first fixture.

17. The method of claim 16, wherein the second fixture comprises a vacuum chuck.

18. The method of claim 1, further comprising the steps of:
    attaching the at least one bridge chip to a wafer prior to bonding the individual chips to the at least one bridge chip; and
    removing the at least one bridge chip from the wafer prior to bonding the multi-chip structure to the packaging substrate.

19. A structure, comprising:
    at least one bridge chip comprising Cu pads on a front side of the at least one bridge chip;
    individual chips bonded to the at least one bridge chip via Cu-to-Cu bonds to form a multi-chip structure, wherein each of the individual chips comprises at least a first Cu pillar having a height Hpillar1 and a second Cu pillar having a height Hpillar2 on a front side of each of the individual chips, wherein Hpillar1>Hpillar2, and wherein the Cu-to-Cu bonds are present between the Cu pads of the at least one bridge chip and the second Cu pillar of each of the individual chips such that the first Cu pillar of each of the individual chips hangs off to a side of the at least one bridge chip; and
    a packaging substrate bonded to the multi-chip structure via solder bonds between the first Cu pillar of each of the individual chips and the packaging substrate.

20. The structure of claim 19, wherein the individual chips comprise logic chips or memory chips.

* * * * *